(12) United States Patent
Chang et al.

(10) Patent No.: US 9,350,372 B2
(45) Date of Patent: May 24, 2016

(54) ARRANGEMENT FOR DIGITAL-TO-ANALOG CONVERTER

(71) Applicant: Taiwan Semiconductor Manufacturing Company Limited, Hsin-Chu (TW)

(72) Inventors: Ching-Ho Chang, Hsinchu (TW); Yung-Chow Peng, Hsinchu (TW); Jui-Cheng Huang, Hsinchu (TW); Wen-Shen Chou, Zhubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 26 days.

(21) Appl. No.: 13/706,428

(22) Filed: Dec. 6, 2012

(65) Prior Publication Data

US 2014/0159932 A1    Jun. 12, 2014

(51) Int. Cl.
*H03M 1/66* (2006.01)
*H03M 1/08* (2006.01)
*H03M 1/74* (2006.01)

(52) U.S. Cl.
CPC ............ *H03M 1/0827* (2013.01); *H03M 1/742* (2013.01)

(58) Field of Classification Search
CPC ...... H03M 1/745; H03M 1/682; H03M 3/376
USPC .................................................. 341/144–154
See application file for complete search history.

(56) References Cited

U.S. PATENT DOCUMENTS

| | | | | |
|---|---|---|---|---|
| 6,738,006 B1 * | 5/2004 | Mercer | ............... | H03M 1/0604 341/144 |
| 7,557,754 B2 * | 7/2009 | Thomas | ................... | G01S 13/74 342/457 |
| 7,773,013 B1 * | 8/2010 | Williams | ............... | H03M 1/747 341/136 |
| 2002/0044076 A1 * | 4/2002 | Yao | .................. | H03K 17/04106 341/136 |
| 2004/0104832 A1 * | 6/2004 | Bugeja | ................ | H03M 1/0643 341/145 |
| 2006/0061499 A1 * | 3/2006 | Seo | .................. | H03K 17/04106 341/144 |
| 2009/0045993 A1 | 2/2009 | Tokumaru et al. | | |
| 2009/0179784 A1 * | 7/2009 | Yagi | .................... | H03M 1/0827 341/144 |
| 2009/0201186 A1 * | 8/2009 | Huang et al. | .................. | 341/144 |
| 2010/0182180 A1 * | 7/2010 | Ikoma | ................. | H03M 1/0604 341/144 |
| 2010/0315276 A1 * | 12/2010 | Ogawa | ................. | H03K 17/302 341/144 |
| 2011/0012469 A1 * | 1/2011 | Zhao | ....................... | H02K 23/26 310/195 |
| 2012/0071114 A1 * | 3/2012 | Kurose | ............................ | 455/91 |

(Continued)

OTHER PUBLICATIONS

Chi, et al., "A CMOS Triple 100-Mbit/s Video D/A Converter with Shift Register and Color Map", IEEEJournal of Solid-StateCircujts,vol. SC-21,No. 6,Dec. 1986, pp. 989-996.
Letham, et al., "A High-Performance CMOS 70-MHz Palette/DAC", IEEEjournal of Solid-Statecircuits, vol. SC-22, No. 6, Dec. 1987, pp. 1041-1047.

(Continued)

*Primary Examiner* — Linh Nguyen
(74) *Attorney, Agent, or Firm* — Cooper Legal Group, LLC

(57) ABSTRACT

Among other things, an arrangement for a digital-to-analog converter (DAC) is provided herein. In some embodiments, a metal-oxide semiconductor (MOS) array of the DAS comprises one or more cells respectively comprising one or more current sources. The current sources comprise one or more transistors having a horizontal gate layout. A switch arrangement of the DAS, to which the MOS array is connected, comprises one or more transistors having a vertical gate layout. Accordingly, in some embodiments, a DAC is provided which comprises transistors having a vertical gate layout and transistors having a horizontal gate layout.

20 Claims, 3 Drawing Sheets

(56) References Cited

U.S. PATENT DOCUMENTS

2013/0106636 A1* 5/2013 Asayama ............ H03M 1/0863
  341/144
2013/0222169 A1* 8/2013 Suzuki ................. H03M 1/785
  341/154

OTHER PUBLICATIONS

Miki, et al., "THAM 11.2: An 80MHz 8b CMOS D/A Converter", 1986 IEEE International Solid-State Circuits Conference, Feb. 20, 1986, pp. 132-133 (3 pages).

* cited by examiner

ARRANGEMENT FOR DIGITAL-TO-ANALOG CONVERTER

BACKGROUND

Generally, a digital-to-analog converter (DAC) is configured to convert digital code into an analog signal. For example, in audio applications, a DAC is configured to generate audio signals that are perceptible to the human ear from digital information stored in a storage medium (e.g., compact disc, digital music player, etc.). In video applications, a DAC is configured to convert digital data (e.g., transmitted over airwaves and/or via other communication mediums such as fiber optic cable) into analog signals to facilitate the display of colors and/or shades on a display, for example.

A DAC is typically a semiconductor device that comprises a metal oxide semiconductor (MOS) array and an arrangement of one or more switching elements. The MOS array is comprised of an arrangement of cells (also referred to as "active cells").

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques and/or systems of an arrangement for a digital-to-analog converter (DAC) are provided for herein. In some embodiments, the DAC is a current-steering DAC comprising a metal-oxide semiconductor (MOS) array and one or more switching elements operably connected to the array. The MOS array is comprised of one or more cells arranged according to a first arrangement and respectively comprising one or more current sources. In some embodiments, at least some of the current sources are comprised of one or more transistors (e.g., referred to as "supply transistors") having a horizontal gate layout. As an example, at least some of the current sources are cascode current sources comprising two or more supply transistors arranged in series and respectively having a horizontal gate layout. In some embodiments, at least some of the switching elements of the DAC are comprised of one or more transistors (e.g., referred to as "switching transistors") having a vertical gate layout. Accordingly, as an example arrangement, the DAC comprises a MOS array comprising supply transistors having a horizontal gate layout and one or more switching elements respectively comprising switching transistors having a vertical gate layout.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features is arbitrarily increased and/or reduced for clarity of discussion.

DETAILED DESCRIPTION

Figure 1:
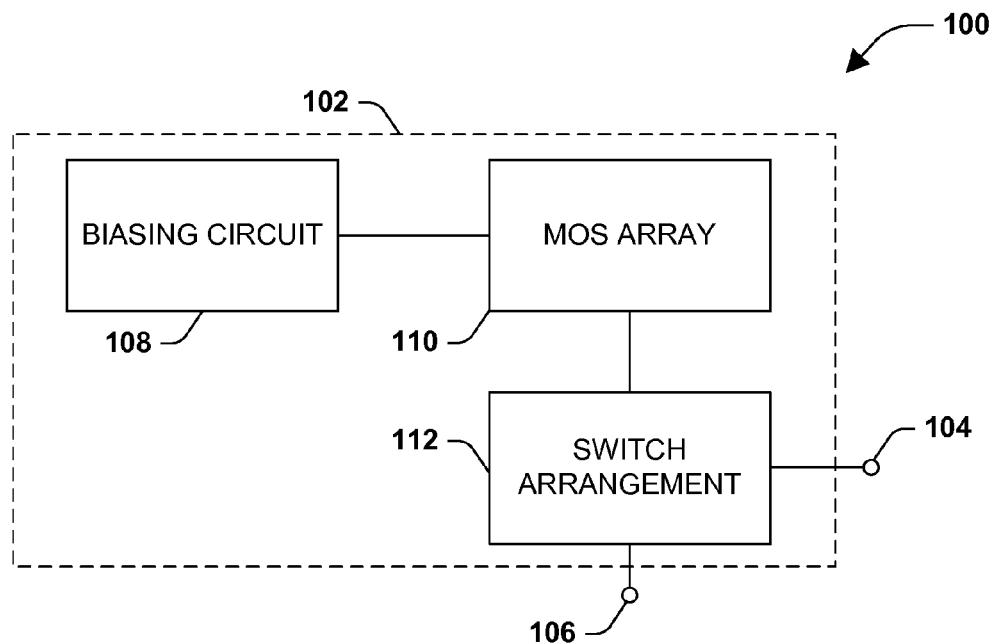
FIG. 1 illustrates a component block diagram of an example DAC according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

Initially, is appreciated that numerical terms such as first, second, third, etc. are used herein to distinguish features and/or components from other components previously presented and are not intended to imply that the components/features are different in configuration. For example, in some embodiments, a first current source and a second current source have a same configuration. In another embodiment, the first current source and the second current source are a same current source. Moreover, a current source may be initially referred to as a first current source and then later referred to as a second current source in another embodiment due to the order in which components/features are presented.

During fabrication of semiconductor devices, such as transistors, for example, fabrication induced non-idealities occur, such as from optical limitations associated with lithography, for example. Such non-idealities include, for example, rounding of a MOS array (e.g., an active region of the semiconductor device), which generally reduces an effective size (e.g., surface area, volume, etc.) of a transistor (e.g., to a size smaller than a designed size for the transistor). Additionally, effective formation effects (e.g., associated with a structure of a transistor) further reduce the effective size of the transistor at least due to lack of support from surrounding structures (e.g., gate, source, drain, etc.), for example. A reduced transistor size generally decreases a driving strength and/or current associated with a device, thus producing unwanted delays in response time, for example. Accordingly, a dummy region is typically formed which surrounds the MOS array to mitigate the impact of such non-idealities with respect to the MOS array (e.g., such as occur due to fabrication).

FIG. 1 illustrates a component block diagram of an example environment 100 for a digital-to-analog converter (DAC) according to some embodiments. More particularly, the example environment 100 illustrates an example current-steering DAC 102 configured to select currents to be applied to an output terminal 106, such as an analog output terminal, as a function of a digital signal received at an input terminal 104. In this way, an analog signal is generated at the output terminal 106 as a function of a digital signal received at the input terminal 104, for example.

The example DAC 102 comprises a biasing circuit 108, a metal-oxide semiconductor (MOS) array 110, and a switch arrangement 112. The biasing circuit 108 is configured to generate a bias voltage, which is applied to one or more current sources of the MOS array 110 by way of a bias voltage signal. In some embodiments, the applied bias voltage facilitates setting or modifying a value of current output by respective current sources connected thereto.

While the example environment 100 provides for a single biasing circuit, in other embodiments the DAC 102 comprises two or more biasing circuits 108. As an example, in some embodiments, a first biasing circuit is connected to a first set of one or more current sources of the MOS array 110 and a second biasing circuit is connected to a second set of one or more current sources of the MOS array 110. As another example, a first biasing circuit is connected to a first portion of a first current source (e.g., such as a first supply transistor of the first current source) and a second biasing circuit is connected to a second portion of a second current source (e.g., such as a second supply transistor of the second current source).

The one or more current sources of the MOS array 110 are respectively configured to supply (e.g., output) a current(s) based upon the bias voltage(s) that is applied by the biasing circuit 108. In some embodiments where the MOS array 110 is comprised of a plurality of current sources, the current output by respective current sources have a same value. In other embodiments where the MOS array 110 is comprised of a plurality of current sources, a first set of one or more current sources are configured to output currents at a first value and a second set of one or more current sources are configured to output currents at a second value, which is different than the first value.

In some embodiments, a number of current sources that comprise the MOS array 110 is a function of a number of bits of a digital signal received at the input terminal 104 (or a number of bits the DAC 102 is configured to receive at the input terminal 104). By way of example, in some embodiments, the DAC 102 is configured to receive an 8-bit digital signal at the input terminal 104 and thus the MOS array 110 comprises at least 256 (e.g., 2^8) current sources. In other embodiments, the DAC 102 is configured to receive a 10-bit digital signal at the input terminal 104 and thus the MOS array 110 comprises at least 1,024 (e.g., 2^10) current sources. In other embodiments, the number of current sources comprised by the MOS array 110 is determined substantially independently of a determination regarding a number of bits the DAC 102 is configured to receive.

Currents generated by the MOS array 110 are provided to the switch arrangement 112, which comprises one or more switching elements. In some embodiments, a number of switching elements that comprise the switch arrangement 112 is a function of a number of current sources that comprise the MOS array 110. For example, in some embodiments, a number of switching elements is equal to a number of current sources (e.g., such that there is a 1:1 ratio of switching elements to current sources). In such embodiments, each current source is uniquely paired to a switching element (e.g., such that each current source is paired to one switching element and each switching element is paired to one current source). Accordingly, a current(s) supplied by a current source is provided to merely the corresponding or paired switching element, for example. In other embodiments, a number of switching elements that comprise the switch arrangement 112 is different than (e.g., greater or fewer than) a number of current sources that comprise the MOS array 110, for example.

As is described in more detail below, switching elements of the switch arrangement 112 are switched according to a value of a digital signal received at the input terminal 104. By way of example, a first set of switches are turned to an "on" position (e.g., allowing current to flow through to the output terminal 106) when the digital signal has a first value and a second set of switches are turned to an "on" position when the digital signal has a second value. In this way, the total current flowing through the switch arrangement 112 and output from the DAC 102 at the output terminal 106 corresponds to a value of the digital signal received at the input terminal 104, for example.

Figure 2:
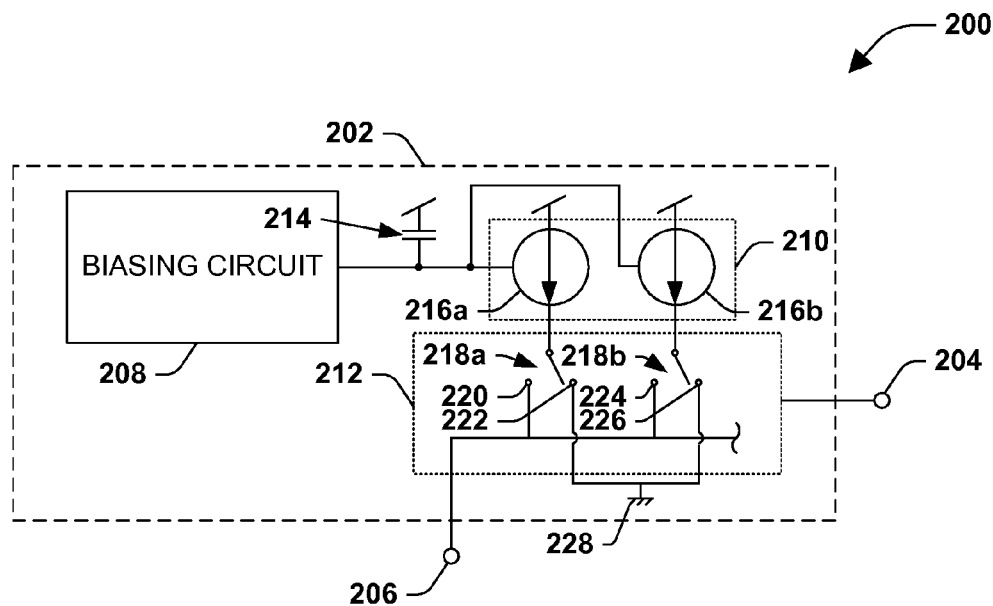
FIG. 2 illustrates an example arrangement of DAC according to some embodiments.

FIG. 2 illustrates an example environment 200 for a digital-to-analog converter (DAC) according to some embodiments. More particularly, the example environment 200 illustrates an example current-steering DAC 202 (e.g., 102 in FIG. 1) configured to convert a digital signal received at an input terminal 204 (e.g., 104 in FIG. 1) into an analog signal, which is output at an output terminal 206 (e.g., 106 in FIG. 1).

The example DAC 202 is comprised of a biasing circuit 208 (e.g., 108 in FIG. 1), a metal-oxide semiconductor (MOS) array 210 (e.g., 110 in FIG. 1), a switch arrangement 212 (e.g., 112 in FIG. 1), and a stabilizing capacitor 214. The MOS array 210 comprises a first current source 216a and a second current source 216b. The switch arrangement 212 comprises a first switching element 218a connected to (e.g., paired with) the first current source 216a and a second switching element 218b connected to (e.g., paired with) the second current source 216b. It is appreciated that in other embodiments, the MOS array 210 comprises a different (e.g., greater) number of current sources 216. In still other embodiments, the switch arrangement 212 comprises a different (e.g., greater) number of switching elements 218 than the two switching elements 218a-b. Further, while the example environment 200 illustrates a one-to-one ratio of current sources 216 to switching elements 218, other ratios are also contemplated.

The biasing circuit 208 is configured to generate a bias voltage, which is applied to one or more current sources 216 of the MOS array 210 by way of a bias voltage signal. In some embodiments, the applied bias voltage facilitates setting or modifying a value of current output by respective current sources 216. As an example, in the illustrated embodiment, the biasing circuit 208 is connected to the first current source 216a and to the second current source 216b. Accordingly, the biasing circuit 208 is configured to generate a bias voltage that is applied to the first current source 216a to facilitate setting/modifying a value of current output by the first current source 216a and that is applied to the second current source 216b to facilitate setting/modifying a value of current output by the second current source 216b. In other embodiments, the second current source 216b is connected to a second biasing circuit (not shown) configured to apply a bias voltage to the second current source 216b that is different than a bias voltage applied to the first current source 216a by the biasing circuit 208, for example.

The stabilizing capacitor 214, which is connected between the biasing circuit 208 and the current sources 216 (e.g., in a supply path of the bias voltage signal output by the biasing circuit 208) is configured to stabilize the bias voltage to a fixed value. In this way, an impact of noise, such as crosstalk, is mitigated, for example.

The current sources 216 are respectively configured to supply a current to a corresponding switching element 218 to which the current source 216 is paired. For example, the first current source 216a is configured to supply a current to the first switching element 218a and the second current source 216b is configured to supply a current signal to the second switching element 218b. As is described in more detail below, the current sources 216 respectively comprise one or more transistors (referred to as supply transistors) having a desired layout and arranged in a specified arrangement. For example, in some embodiments, the one or more supply transistors respectively have a horizontal gate layout and are arranged in a cascode arrangement (e.g., where a cascode current source refers to a current source having supply transistors arranged in a cascode arrangement).

In the example environment, respective switching elements 218 of the switch arrangement 212 are connected to a corresponding current source 216 (e.g., such as through a metal line or other electrical conductive material) and are configured to switch a current supplied by the corresponding current source 216 between two or more terminals as a function of a value of a digital signal supplied to the switch arrangement 212 via the input terminal 204. For example, the first switching element 218a is configured to switch a current supplied by the first current source 216a between a first terminal 220 and a second terminal 222. In the illustrated environment 200, the first terminal 220 is connected to the output terminal 206 (e.g., an analog output terminal) and the second terminal is connected to ground 228. As another example, the second switching element 218b is configured to switch a current supplied by the second current source 216b between a third terminal 224 and a fourth terminal 226. In the illustrated environment 200, the third terminal 224 is connected to the output terminal 206 and the fourth terminal 226 is connected to ground 228. In other embodiments, the second terminal is connected to something other than ground 228. In still other embodiments, the fourth terminal is connected to something other than ground 228, for example.

It is to be appreciated that where the first terminal 220 and third terminal 224 are connected to a same terminal, such as the output terminal 206, current supplied by the first switching element 218a through the first terminal 220 and current supplied by the second switching element 218b through the third terminal 224 is combined such that a signal output by the output terminal 206 is, at times, representative of a combined current supplied via both the first current source 216a and the second current source 216b, for example.

As is described in more detail below, the switching elements 218 respectively comprise one or more transistors (referred to as switching transistors) having a desired layout and arranged in a specified arrangement. For example, in some embodiments, the one or more switching transistors have a vertical gate layout.

In some embodiments, the current supplied to the output terminal 206 via the first terminal 220 and the third terminal 224 is output from the DAC 202 at the output terminal 206 to output an analog signal(s), for example. The current of the signal(s) at a given point in time is a function of which switches provided a current to the output terminal 206 at the given point in time, which is a function of a value of the digital signal 204 received at the switch arrangement 212, for example.

Figure 3:
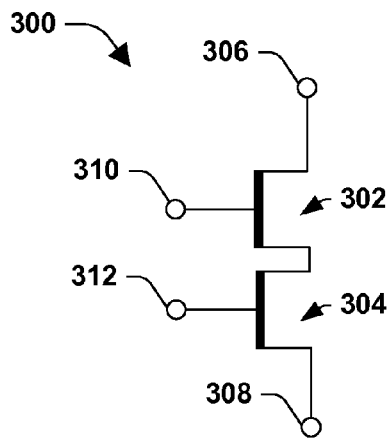
FIG. 3 illustrates an example arrangement of a current source of a DAC according to some embodiments.

FIG. 3 illustrates an example arrangement 300 of an example current source (e.g., 216 in FIG. 2) for a digital-to-analog converter (DAC), such as the DAC 102 of FIG. 1 and/or the DAC 202 of FIG. 2. The example arrangement 300 comprises a first supply transistor 302 and a second supply transistor 304. Although it may not be apparent from FIG. 3, the first supply transistor 302 and the second supply transistor 304 respectively have a horizontal gate layout. That is, the first supply transistor 302 and the second supply transistor 304 respectively comprise a horizontal poly gate, for example.

In the example arrangement 300, the first supply transistor 302 and the second supply transistor 304 are connected in series and form a cascode current source. Moreover, the first supply transistor 302 and the second supply transistor 304 are of a p-type variety. Accordingly, a source of the first supply transistor 302 is connected to a first input terminal 306 for receiving an electrical signal from a power supply and a drain of the first supply transistor 302 is connected to a source of the second supply transistor 304. The drain of the second supply transistor 304 is connected to an output terminal 308 of the current source, which is connected to an input terminal of a switching element (e.g., 218 in FIG. 2), for example.

In other embodiments, the first supply transistor 302 and the second supply transistor 304 are connected in parallel and are of a p-type variety. Accordingly, respective sources of the first supply transistor 302 and the second supply transistor 304 are connected to the power supply via the input terminal 306 and respective drains of the first supply transistor 302 and the second supply transistor 304 are connected to the output terminal 308.

In still other embodiments, at least one of the first supply transistor 302 or the second supply transistor 304 are of an n-type variety. Accordingly, a source of the n-type transistor(s) is connected to a ground power supply, for example.

A gate of the first supply transistor 302 is supplied a bias voltage signal via a second input terminal 310 to turn on and turn off the first supply transistor 302. That is, the first supply transistor 302 is configured to switch open or closed as a function of the bias voltage applied to the first supply transistor 302. Likewise, a gate of the second supply transistor 304 is supplied a bias voltage signal via a third input terminal 312 to turn on and turn off the second supply transistor 304. That is, the second supply transistor 304 is configured to switch open or closed as a function of the bias voltage applied to the second supply transistor 304.

The bias voltage signal supplied to the first supply transistor 302 and the bias voltage signal supplied to the second supply transistor 304 are generated via a same biasing circuit (e.g., 108 in FIG. 1 or 208 in FIG. 2) or via different biasing circuits. For example, in some embodiments, the first supply transistor 302 is supplied a bias voltage signal generated by a first biasing circuit and the second supply transistor 304 is supplied a bias voltage signal generated by a second biasing circuit, which is different that the first biasing circuit. In other embodiments, the first supply transistor 302 and the second supply transistor 304 are supplied bias voltage signals from a same biasing circuit. It some embodiments a value of the bias voltage utilized to switch the first supply transistor 302 is different than a value of the bias voltage utilized to switch the second supply transistor 304. In other embodiments, the value of the bias voltage utilized to switch the first supply transistor 302 is substantially the same as a value of the bias voltage utilized to switch the second supply transistor 304.

Figure 4:
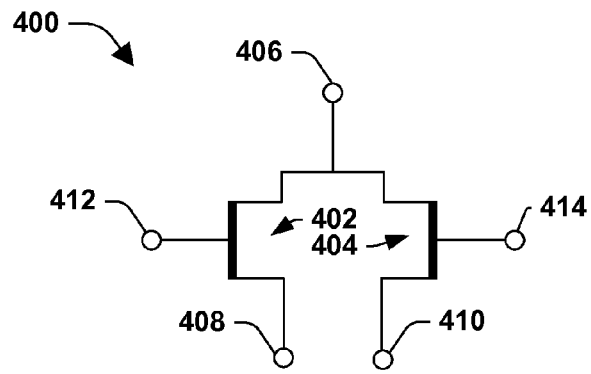
FIG. 4 illustrates an example arrangement of a switching element of a DAC according to some embodiments.

FIG. 4 illustrates an example arrangement 400 of an example switching element (e.g., 218 in FIG. 2) for a digital-to-analog converter (DAC), such as the DAC 102 of FIG. 1 and/or the DAC 202 of FIG. 2, for example. The example arrangement 400 is comprised of a first switching transistor 402 and a second switching transistor 404. Although it may not be apparent from FIG. 4, the first switching transistor 402 and the second switching transistor 404 respectively have a vertical gate layout. That is, the first switching transistor 402 and the second switching transistor 404 respectively comprise a vertical poly gate, for example.

In the example arrangement 400, the first switching transistor 402 and the second switching transistor 404 are of a p-type variety. In other embodiments, the first switching transistor 402 and/or the second switching transistor 404 are of an n-type variety.

In some embodiments, a source of the first switching transistor 402 and a source of the second switching transistor 404 are connect to an input terminal 406 of the switching element, which is connected to an output terminal (e.g., 308 in FIG. 3) of a corresponding current source (e.g., to which the switching element is paired). The drain of the first switching transistor 402 is connected to a first output terminal 408 (e.g., 220 or 224 in FIG. 2) of the switching element, and the drain of the second switching transistor 404 is connected to a second output terminal 410 (e.g., 222 or 226 in FIG. 2) of the switching element. Accordingly, the switching element is configured to switch where current, received at the input terminal 406, is output between the first output terminal 408 and the second output terminal 410.

In some embodiments, the first output terminal 408 is connected to an analog output terminal (e.g., 206 in FIG. 2) of a DAC and the second output terminal 410 is connected to ground (e.g., 228 in FIG. 2). Accordingly, in such embodiments, the switching element is configured to switch between delivering the received current to ground and delivering the received current to the analog output terminal.

A gate of the first switching transistor 402 is supplied a first digital signal via a second input terminal 412 to turn on and turn off the first switching transistor 402 as a function of the applied first signal. Moreover, a gate of the second switching transistor 404 is supplied a second digital signal via a third input terminal 414 to turn on and turn off the second switching transistor 404 as a function of the applied second signal.

It is appreciated that, in some embodiments, the digital signal received at an input terminal (e.g., 204 in FIG. 2) of a DAC is different than the digital signal applied to the gate of the first switching transistor 402. In other embodiments, the digital signal received at an input terminal (e.g., 204 in FIG. 2) of a DAC is different than the digital signal applied to the gate of the second switching transistor 404. By way of example, in some embodiments, the DAC comprises a decoder configured to decode the digital signal received at the input terminal of the DAC prior to applying the digital signal at the gate of the first switching transistor 402 and/or at the gate of the second switching transistor 404. Further, in some embodiments, the digital signal that is applied at the gate of the second switching transistor 404 is inverted relative to the digital signal that is applied at the gate of the first switching transistor 402. As an example, in some embodiments the DAC comprises a decoder configured to decode a digital signal received by the DAC and to provide the decoded digital signal to the second input terminal 412 of the switching element and to an inverter. The inverter, in turn, is configured to invert the decoded digital signal and deliver the inverted digital signal to the third input terminal 414, for example. Accordingly, the digital signal that is received by the first switching transistor 402 has one or more properties that are different than a digital signal received by the second switching transistor 404, for example.

Figure 5:
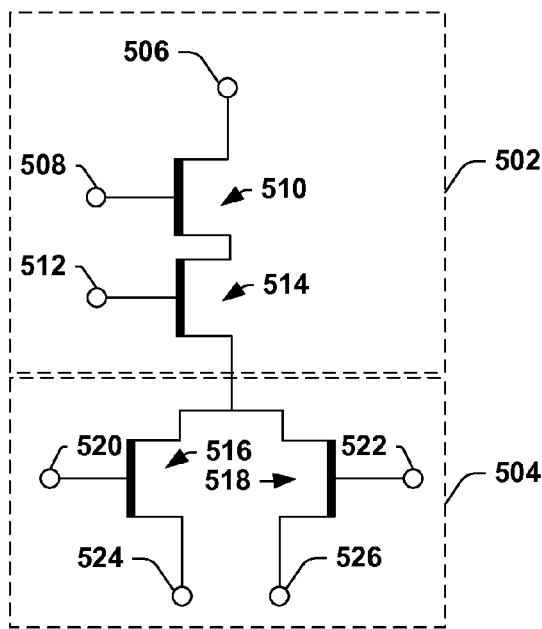
FIG. 5 illustrates an example arrangement of a current source and switching element according to some embodiments.

FIG. 5 illustrates an example arrangement 500 illustrating how a current source 502, such as illustrated in FIG. 3, is connected to a switching element 504, such as illustrated in FIG. 4, via a metal line or other electrically conductive material. It is appreciated that for purposes of brevity, features and components described with respect to FIGS. 3 and 4 are not further described herein in detail but are intended to find applicability to the components of FIG. 5.

The current source 502 of the example arrangement 500 comprises a first input terminal 506 (e.g., 306 in FIG. 3) for receiving a signal from a power supply and a second input terminal 508 (e.g., 310 in FIG. 3) for receiving a bias signal to be applied to a first supply transistor 510 (e.g., 302 in FIG. 3). The current source 502 further comprises a third input terminal 512 (e.g., 312 in FIG. 3) for receiving a bias signal to be applied to a second supply transistor 514 (e.g., 304 in FIG. 3). As illustrated, the first supply transistor 510 and the second supply transistor 514 are arranged in series. In some embodiments, the first supply transistor 510 and the second supply transistor 514 are arranged to form a cascode current source.

The switching element 504 of the example arrangement 500 comprises a first switching transistor 516 (e.g., 402 in FIG. 4) and a second switching transistor 518 (e.g., 404 in FIG. 4), which are mutually connected to the current source 502. The switching element 504 further comprises a first input terminal 520 (e.g., 412 in FIG. 4) for receiving a first digital signal, which controls switching of the first switching transistor 516 (e.g., controls whether the first switching transistor 516 is turned on or off) and a second input terminal 522 (e.g., 414 in FIG. 4) for receiving a second digital signal, which controls switching of the second switching transistor 518 (e.g., controls whether the second switching transistor 518 is turned on or off). The switching element 504 further comprises a first output terminal 524 (e.g., 408 in FIG. 4) for outputting current that flows through the first switching transistor 516 and a second output terminal 526 (e.g., 410 in FIG. 4) for outputting current that flows through the second switching transistor 518.

Figures 6, 7:
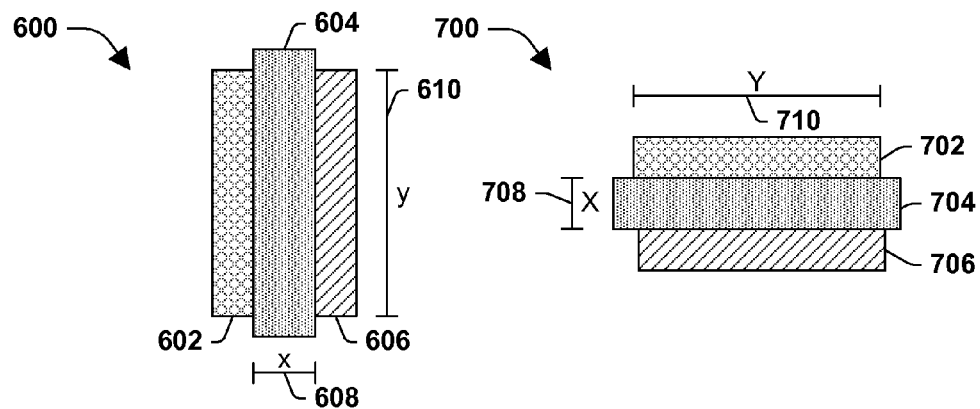
FIG. 6 illustrates a top-down view of an example transistor having a vertical gate layout according to some embodiments.
FIG. 7 illustrates a top-down view of an example transistor having a horizontal gate layout according to some embodiments.

FIGS. 6-7 illustrate example layout configurations 600, 700 for a transistor, such as one or more of the foregoing supply transistors and/or one or more of the foregoing switching transistors. More particularly, FIG. 6 illustrates a top-down view of a transistor having a vertical gate layout 600 and FIG. 7 illustrates a top-down view of a transistor having a horizontal gate layout 700.

Turning first to FIG. 6, an example layout 600 of a transistor having a vertical gate layout is illustrated. Such a layout 600 finds particular application with respect to one or more switching transistors (e.g., 402, 404 in FIG. 4) of a switching element according to some embodiments. The example layout comprises a drain 602, a gate 604 (e.g., a poly gate), and a source 606.

A channel length 608 of a transistor corresponds to a dimension measured between the drain 602 and the source 606 and a channel width 610 corresponds to a dimension of at least one of the source or the drain measured in a direction substantially perpendicular to the channel length. For example, in the illustrated embodiment, the example layout 600 has a channel length 608 that measures "x" and a channel width 610 that measures "y."

With respect to FIG. 7, an example layout 700 of a transistor having a horizontal gate layout is illustrated. Such a layout 700 finds particular application with respect to one or more supply transistors (302, 304 in FIG. 3) of a MOS array according to some embodiments. The example layout comprises a drain 702, a gate 704 (e.g., a poly gate), and a source 706. In the illustrated embodiment, the example layout 700 has a channel length 708 that measures "X" and a channel width 710 that measures "Y."

Figure 8:
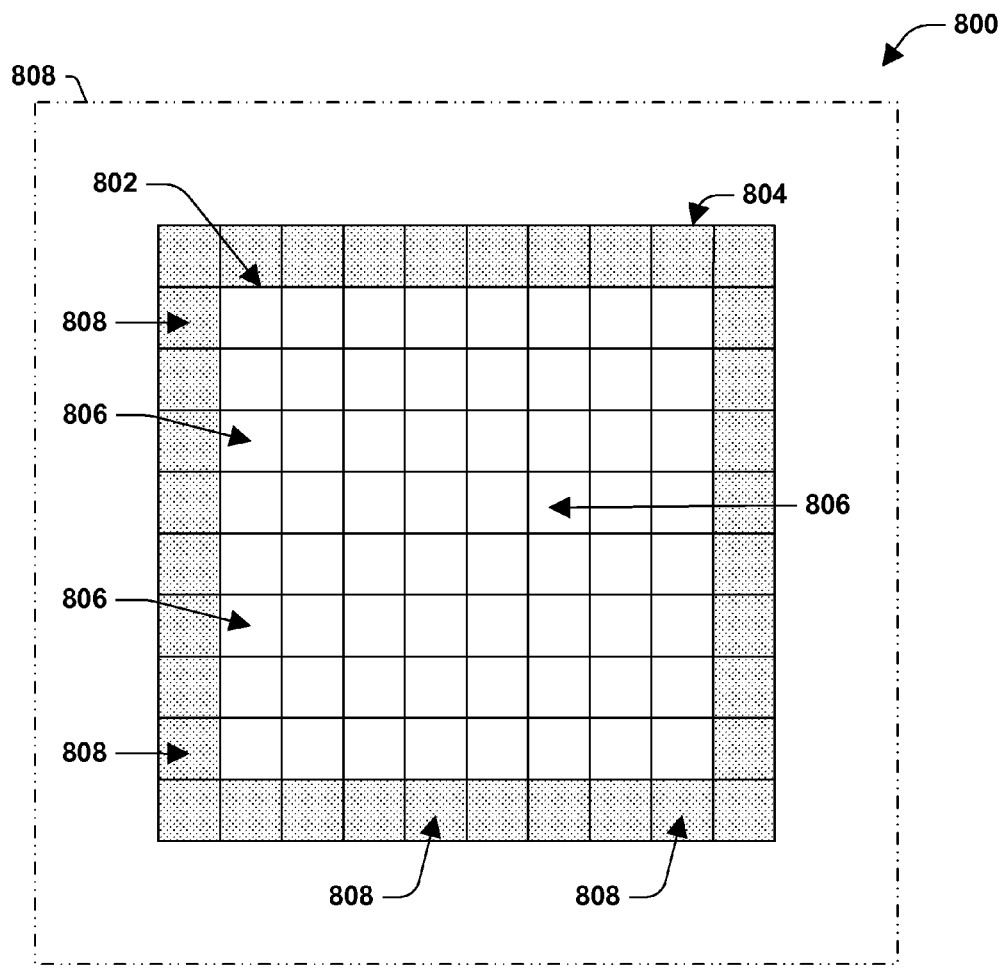
FIG. 8 illustrates an example MOS array and dummy MOS array of a DAC according to some embodiments.

FIG. 8 illustrates an arrangement 800 providing a MOS array 802 that is surrounded by a dummy MOS array 804

(e.g., shaded with dots). The MOS array 802 is comprised of a plurality of cells 806 (e.g., 64 cells in the illustrated embodiment, although the MOS array 802 comprises more cells or fewer cells in other embodiments). Respective cells 806 are comprised of one or more current sources (e.g., 216 in FIG. 2). For example, in some embodiments, a first cell comprises a first current source and a second cell comprises a second current source (e.g., respectively having an arrangement similar to that described with respect to FIG. 3).

In some embodiments, the current sources respectively comprise one or more supply transistors (e.g., 302, 304 in FIG. 3) having a horizontal gate layout (e.g., as illustrated in FIG. 7). By way of example, in some embodiments, the first current source of the first cell comprises one or more supply transistors having a horizontal gate layout and the second current source of the second cell comprises one or more supply transistors having a horizontal gate layout. In some embodiments, respective cells 806 of the MOS array 802 are configured substantially identically. For example, in some embodiments, respective cells 806 comprise 16 current sources (e.g., each having a similar layout such as the layout described with respect to FIG. 3). In other embodiments, the number of current sources that respective cells 806 comprise is more than or is fewer than 16. Further, in some embodiments, at least some cells 806 of the MOS array 802 are configured differently than other cells 806 of the MOS array 802. As an example, in some embodiments, a first set of cells comprises current sources comprising supply transistors with a vertical gate layout and a second set of cells comprises current sources comprising supply transistors with a horizontal gate layout. Typically, at least one supply transistor of the MOS array has a horizontal gate layout.

Surrounding the MOS array 802 is a dummy MOS array 804. The dummy MOS array 804 comprises one or more cells 808 (e.g., which is substantially identical in configuration to cells 806 of the MOS array 802). The dummy MOS array 804 is configured to mitigate the impact of non-idealities with respect to the MOS array 802 (e.g., such as occur during fabrication), for example.

Due to the use of supply transistors having a horizontal gate layout, the size (e.g., surface area, volume, etc.) of the dummy MOS array 804 is relatively small. For example, in some embodiments, a surface area of the dummy MOS array 804 is less than a surface area of the MOS array 802. Further, in some embodiments, the dummy MOS array 804 has a surface area that is less than a surface area of a second dummy MOS array (e.g., where the surface area of the second dummy MOS array is shown by the dash-dot-dot line 808) of a second MOS array (not shown but having a surface area substantially equal to the MOS array 802) which comprises transistors having a vertical gate layout. That is, for example, the surface area of the dummy MOS array 804 is smaller than would be desirable if the MOS array 802 comprised vertical transistors instead of horizontal transistors. In this way, in some embodiments, the size of a combined array (e.g., where the combined array comprises the MOS array 802 and dummy MOS array 804) comprising supply transistors having a horizontal gate layout is (e.g., at least eight times) smaller than the size of a combined array having a substantially similar mis-match performance and comprising supply transistors having a vertical gate layout, for example.

It is appreciated that the foregoing arrangements for a DAC provides numerous benefits over existing DACs. For example, a MOS array 802 comprising transistors having a horizontal gate layout experiences less edge effect (e.g., where transistors proximate an edge of the MOS array perform differently than transistors more proximate to a center of the MOS array due to, among other things, current variation and/or lack of structural support for the source or drain of transistors proximate an edge) than a MOS array comprising transistors having a vertical gate layout. Further, current sources of the MOS array 802 have improved integral non-linearity and/or improved differential non-linearity relative to existing DACs.

Moreover, utilizing switching elements comprising transistors having a vertical gate layout reduces a total size (e.g., area or volume) of the switch arrangement relative to a size of a switch arrangement comprising transistors having a horizontal gate layout. For example, in some embodiments, the channel length of switching transistors having a horizontal gate layout is at least three times larger than the channel length of switching transistors having a vertical gate layout (e.g., due to limitations associated with semiconductor fabrication). In some embodiments, the speed of a DAC is a function of the switching speed of respective switching transistors, which is defined at least in part by $$I_d = \frac{1}{2} u C_{ox} \frac{W}{L} (V_{gs} - V_{th})^2,$$

where W represents channel width and L represents channel length, for example. Accordingly, in such embodiments, a switching arrangement comprising switching transistors having a horizontal gate layout is at least nine times larger than a switching arrangement comprising switching transistors having a vertical gate layout to achieve a substantially same switching speed (e.g., where the switching transistors are three times larger due to the increased channel length due to limitations associated with semiconductor fabrication and an additional three times larger due to an increase in channel width to compensate for the increased channel length).

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as implanting techniques, doping techniques, spin-on techniques, sputtering techniques such as magnetron or ion beam sputtering, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. An arrangement for a digital-to-analog converter (DAC), comprising:
a current source configured to supply a current and comprising a first supply transistor, the first supply transistor comprising:
a first source;
a first drain; and
a first gate between the first source and the first drain, the first supply transistor having a horizontal gate layout; and
a switching element configured to switch a current of the current source between a first terminal and a second terminal, the switching element comprising a first switching transistor, the first switching transistor comprising:
a second source;
a second drain; and
a second gate between the second source and the second drain, the first switching transistor having a vertical gate layout, wherein a channel length of a first channel of the first supply transistor is at least three times larger than a channel length of a second channel of the first switching transistor.

2. The arrangement of claim 1, the first terminal coupled to an analog output terminal and the second terminal coupled to ground.

3. The arrangement of claim 1, wherein the DAC is a current-steering DAC.

4. The arrangement of claim 1, the current source comprising a second supply transistor coupled in series with the first supply transistor, the second supply transistor having a horizontal gate layout.

5. The arrangement of claim 4, the first source coupled to a power supply and the first drain coupled to a third source of the second supply transistor.

6. The arrangement of claim 4, a third source of the second supply transistor coupled to the first drain and a third drain of the second supply transistor coupled to the second source.

7. The arrangement of claim 1, the switching element comprising a second switching transistor, the second switching transistor having a vertical gate layout.

8. The arrangement of claim 1, wherein the current source is a cascode current source.

9. A digital-to-analog converter (DAC), comprising:
a metal-oxide semiconductor (MOS) array comprising an arrangement of cells,
a first cell of the MOS array comprising:
a first current source comprising a first supply transistor having a horizontal gate layout, and
a second cell of the MOS array comprising:
a second current source comprising a second supply transistor having a horizontal gate layout;
a first switching element configured to switch a first current of the first current source between a first terminal and a second terminal, the first switching element comprising a first switching transistor having a vertical gate layout; and
a second switching element configured to switch a second current of the second current source between a third terminal and a fourth terminal, the second switching element comprising a second switching transistor having a vertical gate layout, wherein the first terminal and the third terminal define a common node, the second terminal is coupled to a first voltage source maintaining a first voltage and the fourth terminal is coupled to a second voltage source maintaining a second voltage different than the first voltage.

10. The converter of claim 9, wherein the DAC is a current-steering DAC.

11. The converter of claim 9, wherein the first current source is a cascode current source.

12. The converter of claim 9, the first current source comprising a third supply transistor having a horizontal gate layout.

13. The converter of claim 12, the first supply transistor and the third supply transistor arranged in series.

14. The converter of claim 9, comprising a biasing circuit configured to generate a bias voltage applied to the first supply transistor.

15. The converter of claim 9, comprising a biasing circuit configured to generate a bias voltage that facilitates setting a value of current output by the first current source.

16. The converter of claim 9, the MOS array surrounded by a dummy MOS array.

17. The converter of claim 16, the dummy MOS array having a surface area that is less than a surface area of a second dummy MOS array of a second MOS array, where the second MOS array comprises transistors having a vertical gate layout.

18. The converter of claim 16, the dummy MOS array having a surface area that is less than a surface area of the MOS array.

19. The converter of claim 9, at least one of the first supply transistor or the first switching transistor comprising a p-type transistor.

20. A current-steering digital-to-analog converter (DAC), comprising:
a metal-oxide semiconductor (MOS) array comprising a first supply MOS transistor having a horizontal-gate layout and a second supply MOS transistor having a vertical-gate layout;
a dummy MOS array surrounding the MOS array; and
a switch arrangement comprising a first switching MOS transistor coupled to the first supply MOS transistor and having a vertical-gate layout and a second switching MOS transistor coupled to the second supply MOS transistor and having a vertical-gate layout.

* * * * *